United States Patent
Smits et al.

(10) Patent No.: US 9,859,247 B2
(45) Date of Patent: Jan. 2, 2018

(54) METHOD FOR BONDING BARE CHIP DIES

(71) Applicants: Nederlandse Organisatie voor toegepast-natuurwetenschappelijk onderzoek TNO, The Hague (NL); IMEC vzw, Leuven (BE)

(72) Inventors: Edsger Constant Pieter Smits, The Hague (NL); Sandeep Menon Perinchery, The Hague (NL); Jeroen Van den Brand, The Hague (NL); Rajesh Mandamparambil, The Hague (NL); Harmannus Franciscus Maria Schoo, The Hague (NL)

(73) Assignees: Nederlandse Organisatie voor toegepast-natuurwetenschappelijk onderzoek TNO, The Hague (NL); IMEC vzw, Leuven (BE)

( * ) Notice: Subject to any disclaimer, the term of this patent is extended or adjusted under 35 U.S.C. 154(b) by 33 days.

(21) Appl. No.: 14/441,714

(22) PCT Filed: Nov. 8, 2013

(86) PCT No.: PCT/NL2013/050800
§ 371 (c)(1),
(2) Date: May 8, 2015

(87) PCT Pub. No.: WO2014/073963
PCT Pub. Date: May 15, 2014

(65) Prior Publication Data
US 2015/0294951 A1    Oct. 15, 2015

(30) Foreign Application Priority Data
Nov. 9, 2012 (EP) .................................. 12192091

(51) Int. Cl.
H01L 21/00 (2006.01)
H01L 23/00 (2006.01)
(Continued)

(52) U.S. Cl.
CPC .............. H01L 24/83 (2013.01); B23K 35/02 (2013.01); B23K 35/26 (2013.01); B23K 35/262 (2013.01);
(Continued)

(58) Field of Classification Search
CPC ..... H01L 24/83; H01L 21/4853; H01L 24/11; H01L 23/49816; H01L 21/50;
(Continued)

(56) References Cited

U.S. PATENT DOCUMENTS 3,560,258 A    2/1971    Brisbane
4,752,455 A    6/1988    Mayer
(Continued)

FOREIGN PATENT DOCUMENTS

DE    19946182 A1    3/2001
DE    10237732 A1    3/2004
(Continued)

OTHER PUBLICATIONS

International Search Report—PCT/NL2013/050800—dated Feb. 20, 2014.
(Continued)

*Primary Examiner* — Stephen W Smoot
*Assistant Examiner* — Vicki B Booker
(74) *Attorney, Agent, or Firm* — Banner & Witcoff, Ltd.

(57) ABSTRACT

A method is provided for assembly of a micro-electronic component, in which a conductive die bonding material is used. This material includes a conductive thermosettable resin material or flux based solder and a dynamic release layer adjacent to the conductive thermoplastic material die (Continued)

bonding material layer A laser beam is impinged on the dynamic release layer, adjacent to the die bonding material layer, in such a way that the dynamic release layer is activated to direct conductive die bonding material matter towards the pad structure to be treated, to cover a selected part of the pad structure with a transferred conductive die bonding material. The laser beam is restricted in timing and energy, in such a way that the die bonding material matter remains thermosetting. Accordingly, adhesive matter can be transferred while preventing that the adhesive is rendered ineffective by thermal overexposure in the transferring process.

14 Claims, 7 Drawing Sheets

(51) Int. Cl.
B23K 35/26 (2006.01)
H01L 21/48 (2006.01)
C09J 5/06 (2006.01)
B23K 35/02 (2006.01)
H01L 21/50 (2006.01)
H01L 23/498 (2006.01)
H01L 21/683 (2006.01)
H01L 33/62 (2010.01)
H01L 21/56 (2006.01)
H01L 21/60 (2006.01)

(52) U.S. Cl.
CPC ............ C09J 5/06 (2013.01); H01L 21/4853 (2013.01); H01L 21/50 (2013.01); H01L 23/49816 (2013.01); H01L 24/11 (2013.01); H01L 24/27 (2013.01); C09J 2201/61 (2013.01); C09J 2203/326 (2013.01); C09J 2205/31 (2013.01); H01L 21/563 (2013.01); H01L 21/6835 (2013.01); H01L 23/4985 (2013.01); H01L 24/13 (2013.01); H01L 24/16 (2013.01); H01L 24/73 (2013.01); H01L 24/81 (2013.01); H01L 24/92 (2013.01); H01L 33/62 (2013.01); H01L 2021/60277 (2013.01); H01L 2221/68359 (2013.01); H01L 2221/68381 (2013.01); H01L 2224/111 (2013.01); H01L 2224/11003 (2013.01); H01L 2224/1111 (2013.01); H01L 2224/1133 (2013.01); H01L 2224/133 (2013.01); H01L 2224/13005 (2013.01); H01L 2224/1329 (2013.01); H01L 2224/13111 (2013.01); H01L 2224/14131 (2013.01); H01L 2224/27001 (2013.01); H01L 2224/29011 (2013.01); H01L 2224/29013 (2013.01); H01L 2224/29034 (2013.01); H01L 2224/73103 (2013.01); H01L 2224/73104 (2013.01); H01L 2224/742 (2013.01); H01L 2224/75252 (2013.01); H01L 2224/81191 (2013.01); H01L 2224/81192 (2013.01); H01L 2224/81815 (2013.01); H01L 2224/81862 (2013.01); H01L 2224/83192 (2013.01); H01L 2224/83224 (2013.01); H01L 2224/83862 (2013.01); H01L 2224/9211 (2013.01); H01L 2924/07802 (2013.01); H01L 2924/10253 (2013.01); H01L 2924/12042 (2013.01); H01L 2924/381 (2013.01)

(58) Field of Classification Search
CPC .......... H01L 24/27; C09J 5/06; B23K 35/262; B23K 35/26; B23K 35/02
See application file for complete search history.

(56) References Cited

U.S. PATENT DOCUMENTS

| | | |
|---|---|---|
| 4,987,006 A | 1/1991 | Williams et al. |
| 5,593,808 A | 1/1997 | Ellis |
| 5,873,511 A | 2/1999 | Shapiro |
| 6,060,127 A | 5/2000 | Tatah et al. |
| 6,159,832 A | 12/2000 | Mayer |
| 6,792,326 B1 | 9/2004 | Duignan |
| 7,001,467 B2 | 2/2006 | Pique et al. |
| 7,348,270 B1 | 3/2008 | Danovitch et al. |
| 2002/0071901 A1 | 6/2002 | Ringeisen et al. |
| 2002/0081397 A1 | 6/2002 | McGill et al. |
| 2003/0087476 A1 | 5/2003 | Oohata et al. |
| 2003/0178395 A1 | 9/2003 | Duignan |
| 2003/0180638 A1 | 9/2003 | Tyan |
| 2004/0022947 A1 | 2/2004 | Duignan et al. |
| 2004/0029039 A1 | 2/2004 | Tutt et al. |
| 2004/0033433 A1 | 2/2004 | Foley et al. |
| 2004/0247777 A1 | 12/2004 | Ringeisen et al. |
| 2004/0250769 A1 | 12/2004 | Freeman et al. |
| 2005/0054121 A1 | 3/2005 | Handy et al. |
| 2005/0085385 A1 | 4/2005 | Swihart et al. |
| 2005/0266152 A1 | 12/2005 | Nguyen et al. |
| 2006/0007397 A1 | 1/2006 | Lai |
| 2006/0035454 A1 | 2/2006 | Belanger et al. |
| 2006/0213886 A1 | 9/2006 | Sanders et al. |
| 2006/0234163 A1 | 10/2006 | Zhu et al. |
| 2007/0180991 A1 | 8/2007 | Chellappa et al. |
| 2008/0108171 A1 | 5/2008 | Rogers et al. |
| 2008/0139075 A1 | 6/2008 | Birrell et al. |
| 2008/0299496 A1 | 12/2008 | Hirakata et al. |
| 2008/0314881 A1 | 12/2008 | Ringeisen et al. |
| 2009/0074987 A1 | 3/2009 | Auyeung et al. |
| 2009/0104403 A1 | 4/2009 | Aoyama et al. |
| 2009/0130427 A1 | 5/2009 | Grigoropoulos et al. |
| 2009/0130467 A1 | 5/2009 | Liu et al. |
| 2009/0169809 A1 | 7/2009 | Yokoyama et al. |
| 2009/0217517 A1 | 9/2009 | Pique et al. |
| 2009/0226637 A1 | 9/2009 | Yamazaki |
| 2009/0305445 A1 | 12/2009 | Ikeda et al. |
| 2010/0123258 A1* | 5/2010 | Yim .................. B32B 37/1207 257/783 |
| 2010/0227133 A1 | 9/2010 | Liu et al. |
| 2011/0003440 A1 | 1/2011 | Mengel et al. |
| 2011/0089412 A1 | 4/2011 | Fujimori et al. |
| 2011/0097550 A1 | 4/2011 | Matusovsky et al. |
| 2011/0278566 A1 | 11/2011 | Lee |

FOREIGN PATENT DOCUMENTS

| | | |
|---|---|---|
| EP | 0643153 A1 | 3/1995 |
| EP | 2487215 A1 | 8/2012 |
| JP | H0837206 A | 2/1996 |
| JP | H09-129649 A | 5/1997 |
| JP | H1070151 A | 3/1998 |
| JP | 2001-237279 A | 8/2001 |
| WO | 9805068 A1 | 2/1998 |
| WO | 9850189 A1 | 11/1998 |
| WO | 03054630 A2 | 7/2003 |
| WO | 03056320 A2 | 7/2003 |
| WO | 03101165 A1 | 12/2003 |
| WO | 07071985 A1 | 6/2007 |
| WO | 09081355 A2 | 7/2009 |
| WO | 09090098 A2 | 7/2009 |
| WO | 09146680 A1 | 12/2009 |
| WO | 2009153792 A1 | 12/2009 |
| WO | 11009973 A2 | 1/2011 |
| WO | 11032938 A1 | 3/2011 |
| WO | 11107599 A1 | 9/2011 |
| WO | 11123285 A1 | 10/2011 |
| WO | 11154747 A1 | 12/2011 |

(56) References Cited

FOREIGN PATENT DOCUMENTS

| WO | 12019882 A1 | 2/2012 |
| WO | 2012107556 A2 | 8/2012 |
| WO | 2012107556 A3 | 10/2012 |

OTHER PUBLICATIONS

Digital Microfabrication by Laser Decal Transfer, Pique et al, 2008.
Laser Decal Transfer of Electronic Materials with Thin Film Characteristics, Pique et al.
Laser printing of mutt-layered polymermetal heterostructures, Bimbaum et al, 2010.
Three Dimensional Printing of Interconnects by Laser Direct-Write of Silver Nanopastes by Jiwen Wang et al, 2010.
Triazene photopolymer dynamic release layer-assisted, Banks et al, 2008.

\* cited by examiner

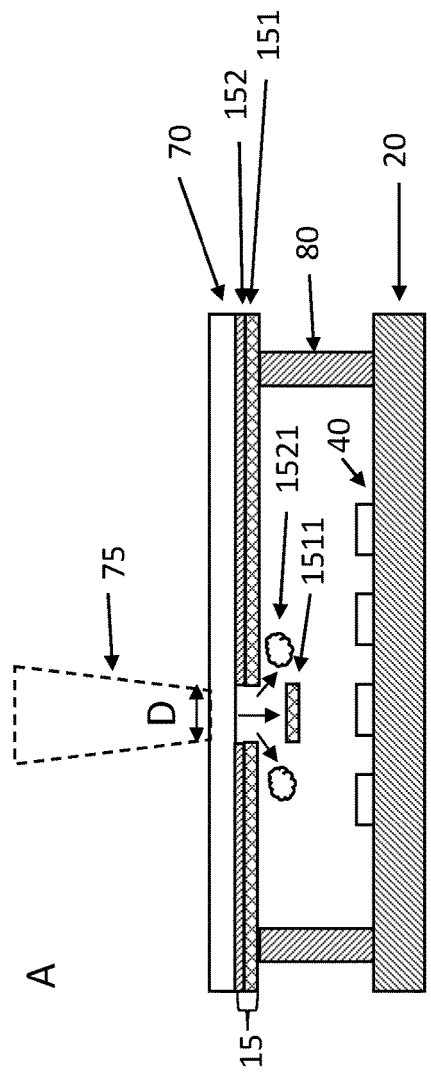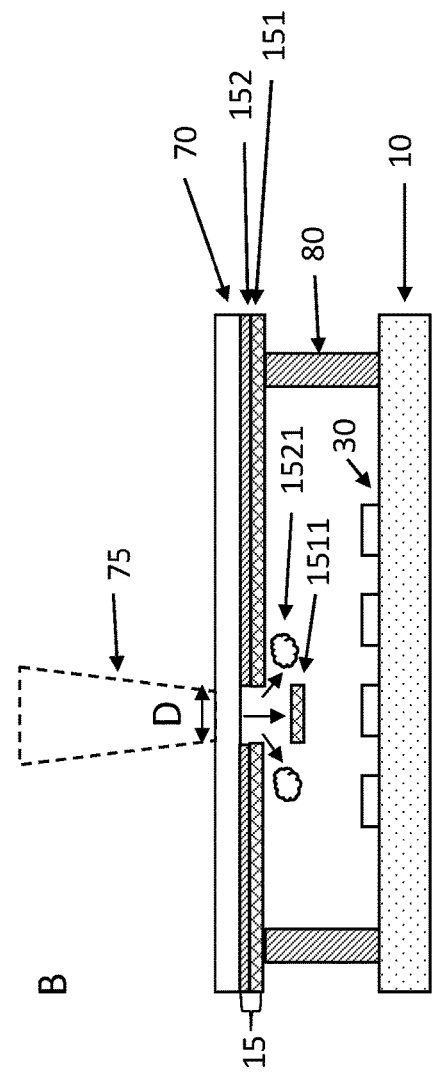

METHOD FOR BONDING BARE CHIP DIES

CROSS-REFERENCE TO RELATED APPLICATIONS

This application is a U.S. National Stage application under 35 U.S.C. §371 of International Application PCT/NL2013/050800 (published as WO 2014/073963 A2), filed Nov. 8, 2013, which claims priority to Application EP 12192091.2, filed Nov. 9, 2012. Benefit of the filing date of each of these prior applications is hereby claimed. Each of these prior applications is hereby incorporated by reference in its entirety.

FIELD OF INVENTION

The invention relates to bare die chip component interconnection and fixation method on a substrate, in particular, a flexible substrate.

BACKGROUND

Interconnection of discrete bare chip components or microelectronic components (chips) on a substrate is a process for which precision material deposition with sufficient accuracy is necessary to allow for miniature electrical or other type of interconnects so that when a chip component becomes attached to a placement position all electrical connection and fixation to the substrate can be made. Typically, it is foreseen to carry out this process by bonding bare dies via an isotropic conductive adhesive or solder pastes face down, i.e. with the electrodes at the bottom of the chip or package pointing to the circuit board electrodes. An example of a conductive adhesives is a thermal or UV settable resin loaded with silver particles. A solder paste typically comprises solder particles and flux. Such solder pastes require flux for removing the oxide layers on the particles and improve wettability during reflow. Both types of interconnections, i.e. conductive adhesives or solder pastes, are sensitive to thermal shock that should be avoided before chip placement. Flux is activated at temperatures above 120 and 150° C. and also for a conductive adhesive a thermal shock will degrade the adhesion properties of the adhesive. Currently there is known a number of methods for printing conductive adhesives and solder pastes for bonding bare silicon or LED chips, interposers or ball grid arrays on flexible substrates. The state-of-the-art methods includes screen printing and stencil printing. The current techniques are efficient; however, they suffer from certain intrinsic limitations.

a) Screen and stencil printing are fast techniques, however they don't have the necessary resolution (100 um approx.). The contact mode and the web movements of the substrate make it prone to dislocation. As it is a contact mode process, damage to fragile substrates is possible and only a single layer of material can be deposited before chip placement. It cannot handle non-flat surfaces and especially for foil based roll to roll processes web deformation cannot be compensated. In addition, fabrication of a screen is expensive, not very flexible and they have to be replaced after 10,000 to 100,000 runs for screen printing and 200,000 for stencil printing. Finally regular cleaning and maintenance is required for proper results.

b) Dispensing and jetting are non-contact methods and do not require stencils or masks. Their resolution is however limited to 250 um which is not sufficient for most bare die Si chips and miniature passive components. In addition they are relatively slow processes with typically throughputs of 10 dots per second.

c) Pintransfer is a possible method however it is restricted in viscosity range and thicknesses of the layers to be transferred and not flexible in the shapes to be transferred In "Three-Dimensional Printing of Interconnects by Laser Direct-Write of Silver Nanopastes" Piqué et al, Advanced Materials Volume 22, Issue 40, pages 4462-4466, Oct. 25, 2010 a laser direct write method is illustrated of a solvent based, dried nanosilver paste that is transferred to a substrate, in order to provide an alternative method for electrical wire bonding interconnects for bare die LEDs. However, this method is not a face down bonding method wherein electrical connections on the chip and on the substrate are pointing in the same direction and it also does not provide any fixation by adhesion to the substrate. It is inadequate since it provides only an electrical connections after placement of the bare die in pockets on a polyimide substrate but no structural adhesion. Moreover, this method is not suitable for most interconnect materials such as thermosettable conductive adhesives as using a laser pulse will cure or degrade the adhesive rendering it unsuited for bonding.

SUMMARY OF THE INVENTION

The prior art assembly has failed to provide an adequate method for high resolution bonding of fine pitch bare dies on flexible substrates providing enough flexibility and reliability, for which the invention seeks a solution. To this end, it is proposed to provide a bonding method of a microelectronic, in particular, a bare die component having one or more electrical connection pads, on a substrate having on its substrate surface a connection pad structure arranged for interconnecting the micro-electronic component via a respective one or more connection pads, the method comprising the steps of:

providing a donor film comprising a bonding material of a curable conductive adhesive or flux based solder paste and a dynamic release layer adjacent to the bonding material layer;

aligning a laser beam of a laser system and guiding the donor film distanced from the substrate surface;

impinging the laser beam on the dynamic release layer; in such a way that the dynamic release layer is activated to cover a selected part of the connection pads or the connection pad structure with bonding matter transferred from the bonding material layer; and administering the micro-electronic component with its pads to the pad structure, so that the bonding matter on one or both the pads and the pad structure forms an electrical connection between the pad structure and a respective pad; and bonding the micro-electronic component with a shear strength of more than 1 Mpa, by curing the conductive adhesive or reflowing the solder paste of the bonding matter.

Accordingly, an alternative bonding method is provided, wherein the bonding matter can be transferred with a desired resolution size, and at the same time preventing that the bonding matter be rendered ineffective by thermal overexposure in the transferring process. The bonding matter can be formed by a thermosettable or thermoplastic adhesive or by a flux containing solder paste wherein, in the transfer of the flux containing solder paste from the die bonding material to the substrate surface, the laser beam is restricted in timing and energy, in such a way that the flux remains intact within the transferred bonding matter. It is understood that the bonding matter remains intact when the bonding material keeps its bonding properties after transferring the bonding matter from the bonding material layer to the pads or pad structure, i.e. that the bonding matter remains suitable for bonding by means of the fixing step, i.e. curing the thermosetting material or reflowing the solder paste. In this way an efficient bonding method is provided wherein pads of the micro-electronic component can be bonded and electrically interconnected with resolution spot sizes that are significantly smaller than the conventional pad sizes in particular, by positioning the micro-electronic components with reference to micro-features arranged on a flexible substrate.

BRIEF DESCRIPTION OF THE FIGURES

FIG. 2. Shows schematic embodiments of a setup for transferring the adhesive or solder matter.

DETAILED DESCRIPTION

In an aspect, a direct write method is provided for high speed positioning die bonding material for discrete chip components on substrates, which can be operated in a reel to reel manufacturing fashion. In particular, the method can be used for high resolution deposition of highly viscous materials. With the attainable resolution of the disclosed methods and systems, that a resolution spot size of transferred die bonding material may be attained with a spot diameter of the transferred bonding material that is smaller than 50 micron.

Figure 1:
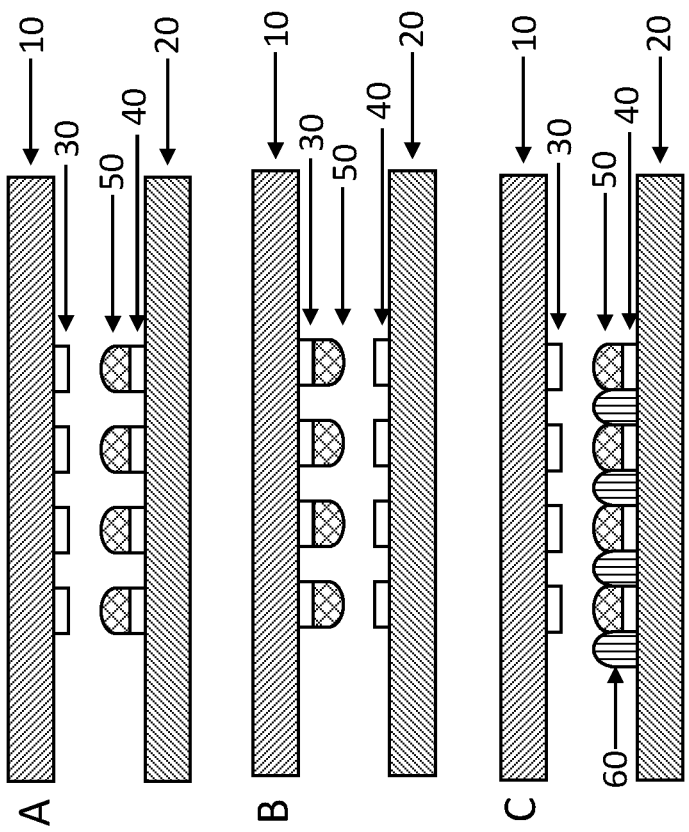
FIG. 1. Shows schematic assembly methods for a micro-electronic component.

FIG. 1 illustrates schematically several embodiments (A,B,C) of methods for bonding discrete pads 30 of a bare die chip components (chips) 10 on a pad structure 40 of flexible substrate 20. As illustrated further below, the method has sufficient accuracy to correct for web deformations of the flexible substrate 20. The term "flexible substrate" used in this text refers in particular to a substrate that is bendable enough to be used in a reel to reel process. In other words a flexible substrate as used in this text is a substrate that is flexible enough to allow bending over a certain curvature, e.g. with a radius of 1-100 centimeters (depending on the reel diameter), without the substrate losing essential functionality. Supply of chip bonding material matter 50 can be placed on the pad structure 40 (FIG. 1A) or on chip pads 30 as for example illustrated in FIG. 1B. The chips 10 may then be bonded on a pad structure 40 of the substrate 20 web directly. In addition or alternatively, a composite pattern of conductive die bonding matter and structural adhesive 60 may be provided (FIG. 1C). Also, alternatively, the method can be provided for interconnecting pad structures arranged on laminated flexible substrates.

FIGS. 2A and 2B show exemplary transfer setups for transferring die bonding matter 1511 to a pad structure 40 on a substrate 20 (Figure A) or to pads 30 of bare the 10 (FIG. 2B) for the method as presently claimed. In an embodiment, a bonding method of a micro-electronic, in particular, a bare die component 10 is provided having one or more electrical connection pads, on a substrate 20 having on its substrate surface a connection pad structure 40 arranged for interconnecting the micro-electronic component via a respective one or more connection pads, the method comprising the steps of:
  providing a donor film comprising a curable conductive adhesive 151 and a dynamic release layer 152;
  aligning a laser beam of a laser system and guiding the donor film distanced from the substrate surface;
  impinging the laser beam on the dynamic release layer; in such a way that the dynamic release layer is activated to cover a selected part of the connection pads or the connection pad structure with adhesive 50 transferred from the donor film; wherein the laser beam is restricted in timing and energy, in such a way that the transferred adhesive remains curable;
  administering the micro-electronic component 10 with its pads to the pad structure, so that the bonding matter on one or both the pads and the pad structure forms an electrical connection between the pad structure and a respective pad; and
  curing the conductive adhesive between the pads and the pad structure to bond the micro-electronic component with a shear strength of more than 1 Mpa.

In an embodiment, a bonding method of a micro-electronic, in particular, a bare the component 10 is provided having one or more electrical connection pads, on a substrate 20 having on its substrate surface a connection pad structure 40 arranged for interconnecting the micro-electronic component via a respective one or more connection pads, the method comprising the steps of:
  providing a donor film comprising a solder paste 151 and a dynamic release layer 152;
  aligning a laser beam of a laser system and guiding the donor film distanced from the substrate surface;
  impinging the laser beam on the dynamic release layer; in such a way that the dynamic release layer is activated to cover a selected part of the connection pads or the connection pad structure with solder paste 50 transferred from the donor film; wherein the laser beam is restricted in timing and energy, in such a way that the transferred solder paste includes flux consisting of more than 10% volume percent of flux;
  administering the micro-electronic component 10 with its pads to the pad structure, so that the solder paste on one or both the pads and the pad structure forms an electrical connection between the pad structure and a respective pad; and
  reflowing the solder paste between the pads and the pad structure to bond the micro-electronic component with a shear strength of more than 1 Mpa.

In contrast to prior art methods, the embodiments have as common concept that they provide for high speed high resolution bonding of micro-electronic components after placement thereof with their pads to respective pad structures of the substrate. Since the transferred adhesive or solder paste respectively remains intact, in particular, curable, or reflowable, during transfer, i.e. before placement, the bonding properties are optimal, so that after placement of the component 10 on the pad structure, the bonding matter, in particular, the adhesive or solder paste can be cured or reflowed respectively, to provide a robust bonding with electrical connectivity, that may have a bonding strength of more than 1 Mpa. This is a method that can be very efficient and cost effective for large scale industry purposes.

In the setup, a laser spot as formed with a spot size D of about 20-200 micron, in particular, an Nd:YAG or excimer laser with fluencies of 20-300 mJ/cm$^2$, more particular, 40-150 mJ/cm$^2$.

The spot is aimed on a transparent carrier substrate 70, in the example, a quartz glass for a 248 nm KrF excimer and PET or Soda Lime Glass for a 355 nm Nd:YAG laser. On the substrate 70 a conductive die attach die bonding material 15 is provided comprising a die bonding material layer 151 of a conductive thermosetting material or flux based solder paste and a dynamic release layer 152 adjacent to the conductive thermosetting or flux based solder material die bonding material layer 151. Dynamic release layers are well known in the art and typically comprise a composition formed in a layer, that abruptly locally transforms in gaseous substance, when locally irradiated so that dynamic release is provided by propulsion of the gaseous substance. In the example, the dynamic release layer 152 is formed by a Triazene layer of about 100 nm thickness which functions as a sacrificial dynamic release layer (DRL), and comprises a polymer that, when photoactivated decomposes into nitrogen and other organic volatile gases 1521. Other compositions to the effect that a dynamic release is provided of the substance provided on the dynamic release layer 152, i.e. dynamic release of bonding material of a curable conductive adhesive or flux based solder paste from the dynamic release layer 152 to a selected part of the connection pad structure 40 may be equally suitable. A typical peak absorption is found at 290-330 nm and the ablation threshold: 22-32 mJ/cm$^2$ at 308-248 nm is quite low so that the donor die attach film layer or solder paste is not thermally loaded and remains intact after transfer, in such a way that the the bonding matter 1511 remains thermosettable. For example, the laser beam may be restricted in timing and energy, in such a way that bonding matter, transferred by dynamic release from the dynamic release layer 152 to the selected part of the connection pad or connection pad structure 40 remains curable or consists of more than 10% volume percent of solder flux. Accordingly a desired material property can be retained during transfer from the dynamic release layer 152 to the pad structure by impinging the laser beam on the dynamic release layer 152 adjacent to the conductive thermosettable material of die bonding material layer 15; in such a way that the dynamic release layer 152 is activated to direct the conductive die attach die bonding matter 1511 to cover a selected part of the substrate 20 with transferred conductive die bonding material.

Covering the selective part with conductive die bonding material clearly has the function of providing a suitable electrical connection between the pad structure and conductive die. In the example, a thermosettable isotropic conductive adhesive material 151 is transferred, as can be seen by in the FIGS. 2a and 2b. having electrical conductivity on for instance coated Cu substrates or silver tracks with a volume resistivity of typically 4-10 E-4 Ohm·cm and a typical curing temperature of 10 to 3 min @ 120-150° C., commercially available as CE 3103 WLV from Henkel, with a viscosity of 15-25 Pa·s. To illustrate the general applicability of the method, another experimental conductive adhesive from Henkel is transferred consisting of a highly viscous conductive adhesive with a viscosity of 160-180 Pa·s that is cured in around 10 min at 150° C. The conductive adhesive 151 is provided as homogenous layer of 20-30 micron, in particular, 25 micron thick provided on the dynamic release layer 152. The thickness is controlled to be around 25 um or 50 um but could be theoretically be of any thickness. The donor bonding materials are held at a distance of about 13-150 micron away from the substrate by shims 80.

In addition the conductive adhesive may also be replaced by a flux based Sn96.5Ag3Cu0.5 type 5 solder paste. Proper transfer of the solder with the flux can be achieved and functionality may be confirmed by reflow. Also nonconductive structural adhesives or pressure sensitive adhesives may be transferred successfully. The adhesive may have a viscosity of 1.2 Pa·s.

In an embodiment, a die bonding material layer may be a 15-30 micron thick solid thermoplastic layer with a high conductivity of about 7E-4 Ohm·cm and a curing schedule of about 1.5 h @ 175-200° C.

Figure 3A:
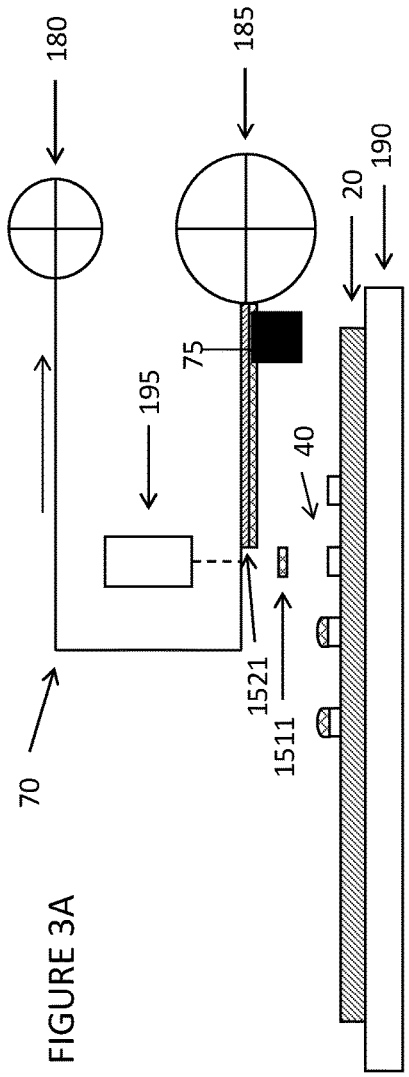
FIG. 3. Shows a tape based feed system for implementing the bonding method.
Figure 3B:
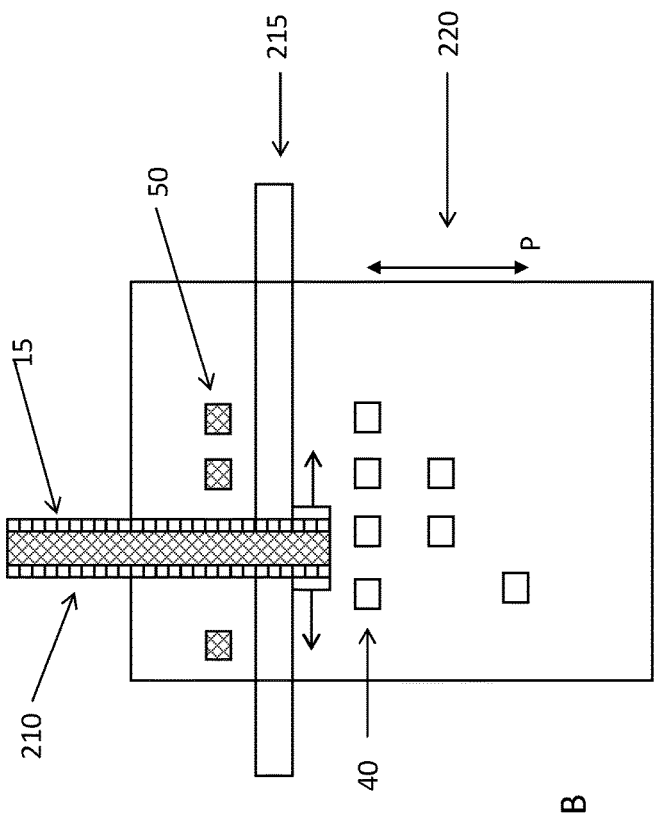

In FIGS. 3A and 3B transfer systems are illustrated for transferring conductive thermosettable adhesives or solder paste from a tape 70 on a reel 185 and wound back to a reel 180. The bonding method as disclosed herein is adaptive and enables in combination with an alignment detection system accurate and adaptable corrections that renders it suitable for placement on a flexible foil wherein web integrity typically cannot be guaranteed. In FIG. 3A, tape 70 can be made from PET foil and is passed through a donor feed system 75 where it is aligned under the beam of a laser 195 and transferred to pad structures 40 of an acceptor substrate 20. The substrate can be moved by a motorized stage 190 that can be moved in accordance with alignment control means that align the substrate 20 relative to the laser 195. FIG. 3B show another example wherein a donor film 15 is moved by a motorized stage 220 having respective guides 210 and 215 for guiding the film in an X-Y fashion over a substrate 20. The substrate may be moving in a transport direction P by stage 220. The laser 195 may be moved mechanically or optically, so that the transfer of bonding matter 1511 can be aligned relative to the substrate 20.

Figure 4:
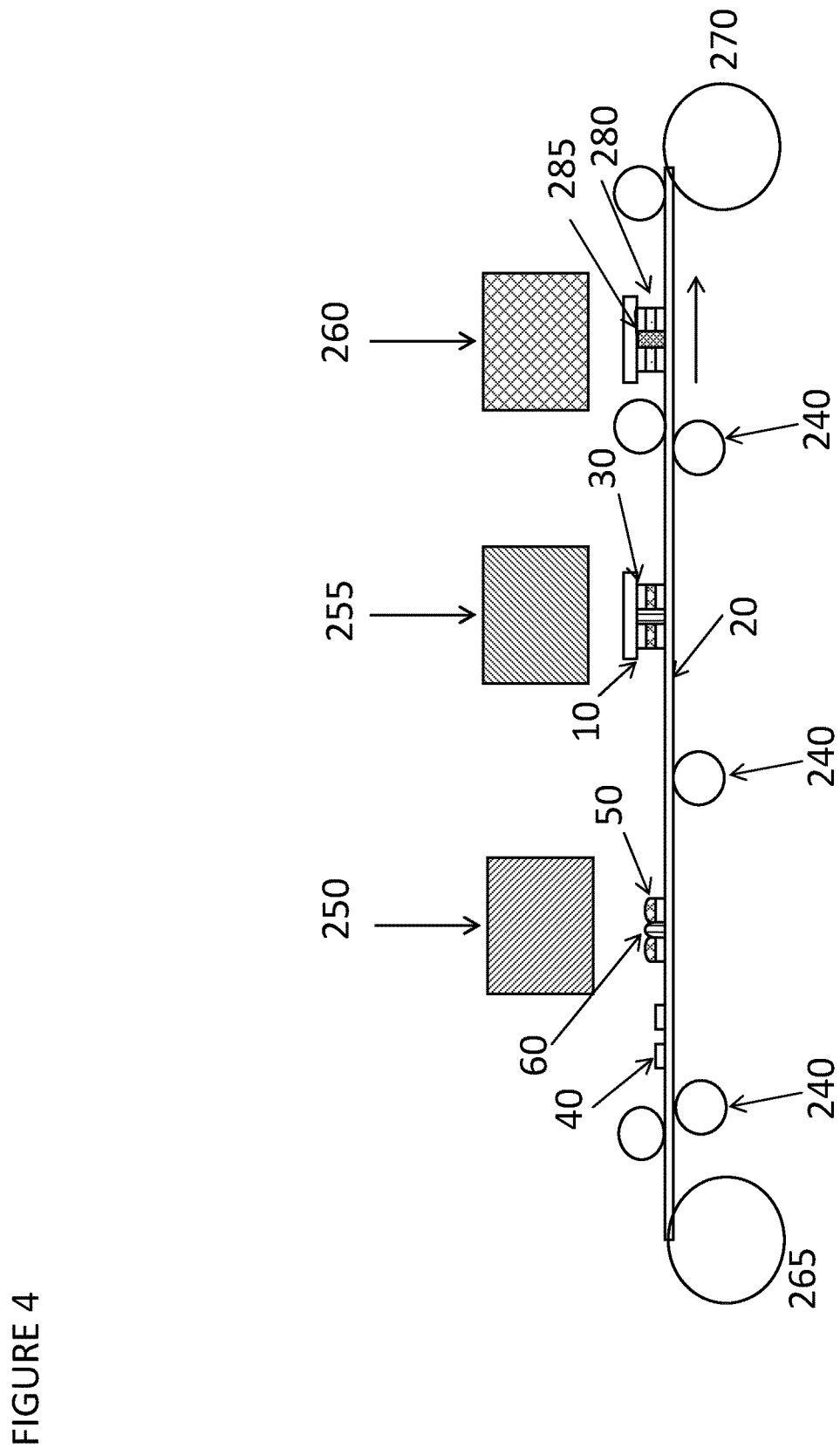
FIG. 4. Shows a roll to roll feed system for the chip assembly
FIG. 5 Show the schematic embodiment for interconnecting ball grid array type structures to a substrate

FIG. 4 shows a schematic assembly process for a microelectronic component 10 that includes transferring chip bonding and interconnect matter by the LIFT method in transfer section 250 as illustrated in the preceding. In particular, a bare chip component interconnection method is disclosed for the interconnecting and bonding a bare chip component 10 on a flexible substrate or foil 20 with conductive die attach matter 50 and nonconductive die attach matter 60. The method involves providing a flexible substrate 20 with contacts 40 and providing a bare chip component 10 with contacts 30 to be placed on a predefined placement by positioning means 255. The method involves a thermal exposure step 260 where the chip is permanently fixed by curing the conductive thermoset or reflowing solder melt 280 and optionally the thermoset nonconductive adhesive 285 before the flexible substrate said foil is wound back onto the reel 270.

In the disclosed reel to reel method of FIG. 4, a substrate 20 or carrier web is unwound from a first reel 265 and guided via a set of guide rollers 240 to a second reel 270 to be wound up. In the unwound condition, various sub processes can be carried out, in particular, as one of the sub processes, bare chip component bonding as currently disclosed in the previous FIGS. 1 and 2. In particular, these sub processes may involve:

- making 250 interconnects by LIFT transfer process directing conductive and nonconductive die bonding matter 60 to acceptor
- supply of a bare chip component 10, for example, a silicon based bare chip component or LED 10, to the target area on the substrate 20 by a pick and place unit 255 onto the interconnect material and controlling the pressure;

fixing of the die chip component 10 by a thermal curing unit 260 by thermosetting of the conductive and non-conductive adhesive 60 and/or reflow of the solder paste.

The chips 10 may be secured permanently to the substrate at the placement position e.g. by a bonding tool 260 such as a heater that activates the thermosetting material in the electrically conductive die bonding donor material that is thermosetting in a curing temperature region with a temperature elevated from the LIFT operating temperature in 260 so that the component is fixed by thermal curing, or any other known method for attaching chips to a (flexible) substrate.

Figure 5:
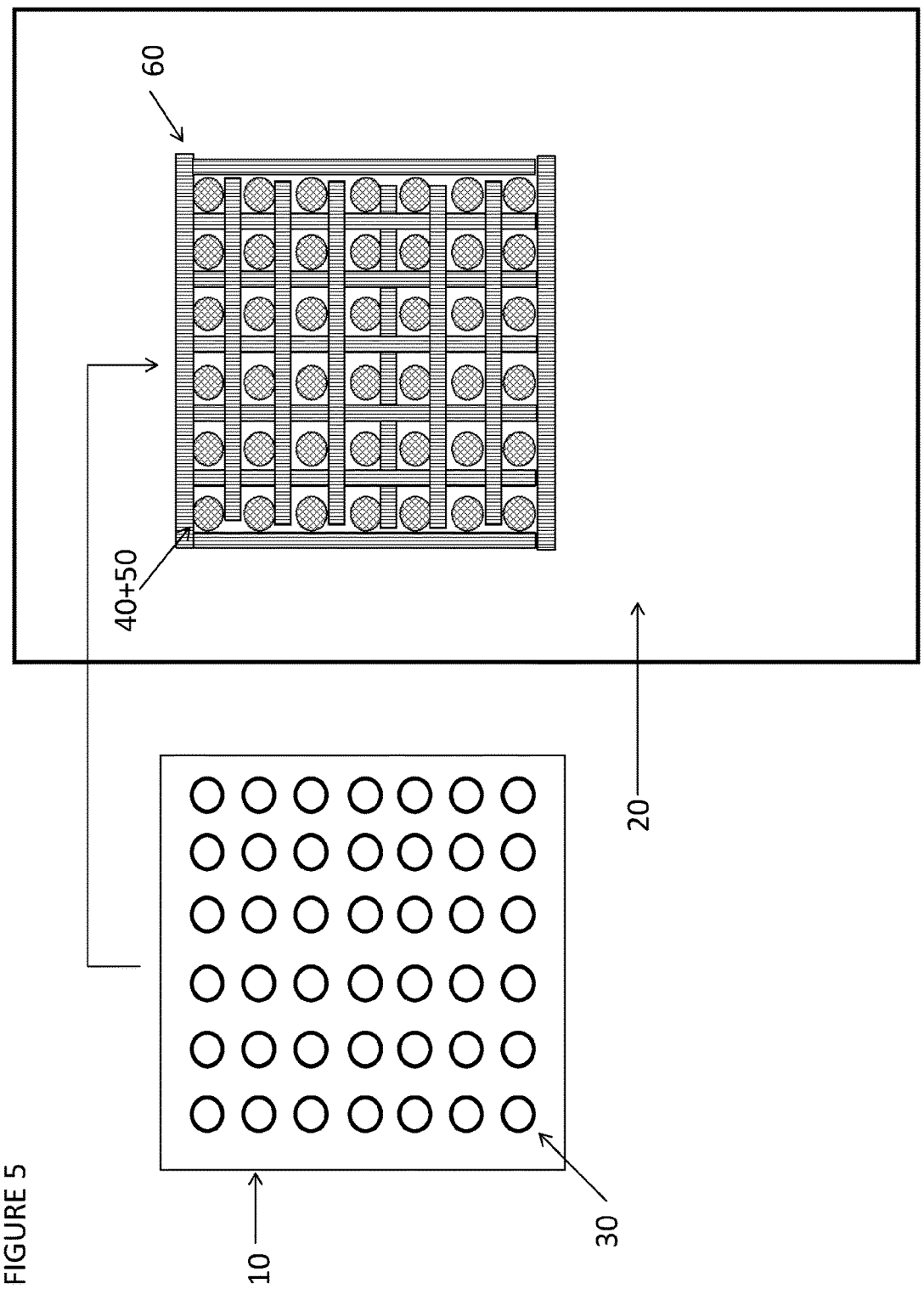

In an example configuration demonstrated in FIG. 5 the bump array consists of bumps 40 on a substrate 20 with diameters typically in the range of 10 to 500 micron. The density is preferably such that a sufficient number of bumps 30 are under a chip 10 to be placed. e.g. if the chip is of 1 mm edge length for instance a distance of 200 microns may be still sufficient (5 bumps×5 bumps under the chip). Solder paste or thermosettable adhesive 50 bumps may be placed onto the bond pads or onto the substrate pads and subsequently the bump array 30 of the chip 10 may be placed and bonded onto the substrate by e.g. a flip chip method. In addition, structural adhesive 60 may be transferred for further structural bonding.

Figure 6:
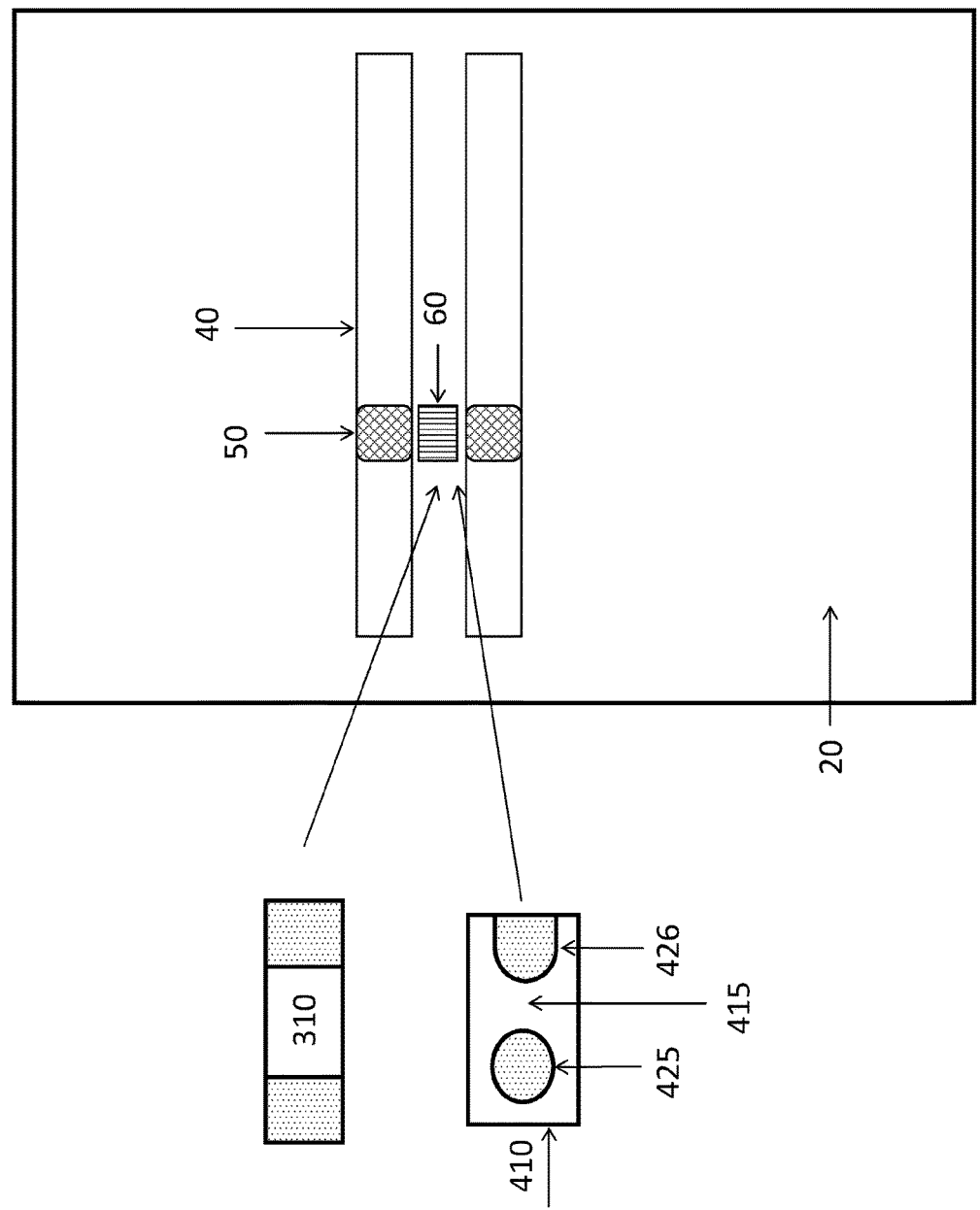
FIG. 6 shows the schematic embodiment for the interconnection of a passive component or bare die on a foil

In the current example of FIG. 6 further microelectronic components such as passive components e.g. resistors, capacitors or inductors 310 or bare die LED's 410 may be placed on a prepatterned foil 20, wherein conductive adhesive or solder paste 50 and nonconductive adhesive 60 is applied by means of the above illustrated technique. Both the resistor 310 or bare die LED 410 are to be connected in the current example with the substrate foil 20 through conductive bumps to conductive tracks 40. In particular, such circuits are advantageously applied on a flexible substrate to be applied e.g. on silver or copper tracks on PEN or PET foils. A typical chip height may vary e.g. between 0-250 micrometers. The bare the LED 410 has an anode bump 425 and cathode bump 426 of about 80×80 micron or even smaller to about 50×50 micron, and a junction area 415 (LED part) of about 230×190 micron.

While the invention has been illustrated and described in detail in the drawings and foregoing description, such illustration and description are to be considered illustrative or exemplary and not restrictive; the invention is not limited to the disclosed embodiments. In particular, unless clear from context, aspects of various embodiments that are treated in various embodiments separately discussed are deemed disclosed in any combination variation of relevance and physically possible and the scope of the invention extends to such combinations. Furthermore for any of the conductive or non-conductive adhesives, the deposition step can be carried out as one embodiment of a method of treatment of bumps for chip dies in a chip manufacturing process. The method comprises clamping a wafer having identified bumps to be provided with a conductive adhesive; providing a conductive die attach donor film distanced from the wafer top surface; aligning the laser beam of the laser system and guiding the conductive the attach donor film relative to an identified bump on the wafer; and impinging a laser beam on a side of the conductive die attach donor film opposite a side facing the wafer; the laser beam tuned in timing, energy and direction to generate conductive die attach donor film matter directed towards a bump to be treated.

A further embodiment involves a multishot process repeated steps are provided of guiding fresh conductive the attach donor film relative to the bump and impinging the laser beam on the conductive die attach donor film so as to direct a particle of conductive the bonding matter onto the bump.

To achieve cost-effective interconnecting at a rate of at least 1000-3000 bumps per second, a laser repetition rate is preferably at least 60-600 kHz. For a conductive die attach donor film to be refreshed at these rates a conductive the attach donor film refreshment module with high refresh rate capabilities is very advantageous, for example having a conductive the attach donor film refreshment velocity relative to the bump of more than 0.1 m/s. The high laser repetition rate combined with a relative high number of about 60-200 of bumps provides an effective operation range for this chip bonding application competitive with stencil or screen printing and far superior to the deposition rate to that of jet printing with approx. 10 bumps per second.

Figure 7:
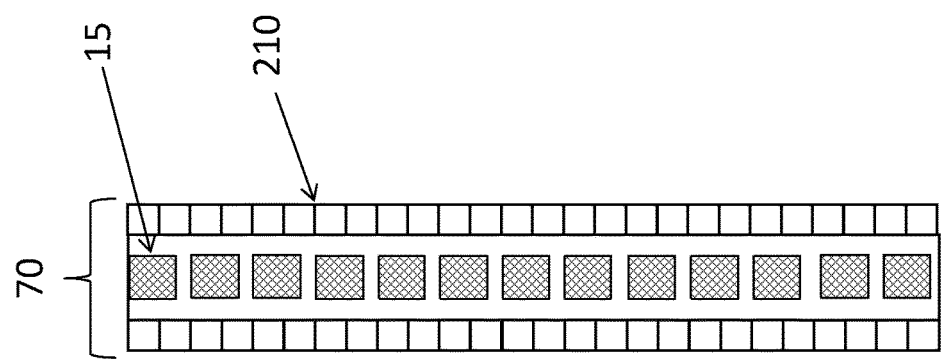
FIG. 7 shows an example of a structured donor film.

FIG. 7 shows an example of a structured donor film 70. To enhance the forming of a well-defined bonding matter, the donor film may be provided in a premachined form, for example, comprising a sacrificial layer, a prepatterned conductive the bonding material layer provided in a matrix 15 of sacrificial material. A suitable thickness of the homogenous layer may range between 50 and 2000 nm, preferably in a range of 50-500 nm or even more preferably in a range of 50-250 nm.

Alternatively an embodiment for treatment of a bump can be carried out by stepping i.e. a non-roll to roll process. For example a fast beam modulator (galvano mirror, polygon mirror, acousto-optic or electro-optic modulator etc.) provides a scanning movement of the laser beam in a first direction. The modulator may be controlled in a feed forward process wherein bump coordinates are provided from an external source that provides the layout data of a chip die. Alternatively, the modulator can be used as a scanning unit that maps the bump coordinates in a prescan stage. Alternatively, an additional optical feedback system may provide laser alignment relative to the bump. Optionally, a main beam is split into about 2-20 sub beams. In the embodiment, each single bump may be treated by a multishot process where repeated steps are provided of guiding fresh conductive die attach the bonding material relative to the bump and generating a donor matter.

Other variations to the disclosed embodiments can be understood and by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. Any reference signs in the claims should not be construed as limiting the scope. The advantage of the disclosed laser transfer process over conventional printing is the range of use: for the intended features with a resolution <50 μm stencil printing techniques generally fail (resolution spot size typically 75 μm) and jet printing even more (typical resolution spot size: 200 μm). In addition, the donor matter may have a wide-range of viscosity, possible to transfer (from 1 Pa·s to 160 Pa·s (non-exhaustive)). For stencil printing typical viscosities are >50 Pa·s and for Inkjet printing typical viscosities are <0.1 Pa·s. Contrary to stencil printing and screen printing it is a non-contact direct write method with the possibility of on the fly correction for web deformations using a vision system.

The invention claimed is:

1. A bonding method of a micro-electronic component, in particular, a bare die component having one or more electrical connection pads, on a substrate having on its substrate surface a connection pad structure arranged for interconnecting the micro-electronic component via a respective one or more connection pads, the method comprising the steps of:
    providing a donor film comprising a bonding material of a curable conductive adhesive or flux based solder paste and a dynamic release layer adjacent to the bonding material layer;
    aligning a laser beam of a laser system and guiding the donor film in an X-Y fashion over the substrate at a distance from the substrate surface;
    impinging the laser beam on the dynamic release layer; in such a way that the dynamic release layer is activated to cover a selected part of the connection pads or the connection pad structure with bonding material transferred from the bonding material layer; and
    administering the micro-electronic component with its one or more electrical connection pads to the pad structure, so that the bonding material on one or both of the pads and the pad structure forms an electrical connection between the pad structure and a respective pad; and
    bonding the micro-electronic component with a shear strength of more than 1 Mpa, by curing the conductive adhesive or reflowing the solder paste of the bonding material.

2. A method according to claim 1, wherein the bonding material is thermoplastic in an operating temperature region and that is thermosetting in a curing temperature region with a temperature elevated from the operating temperature.

3. A method according to claim 1 wherein the operating temperature ranges in a range of 10 degrees Celsius to 180 degrees Celsius.

4. A method according to claim 1 wherein the substrate is a flexible substrate having a radius of curvature of at least 1 cm.

5. A method according to claim 1, wherein a distance to the die surface is kept in a range of 1-200 micron.

6. A method according to claim 1, wherein the die bonding material layer has a thickness in a range between 10-50 micron.

7. A method according to claim 1, wherein the donor film is provided with a premachined patterning.

8. A method according to claim 7, wherein premachined patterning forms a grid with a grid size that coincides or is smaller than a laser spot size.

9. A method according to claim 8, wherein the patterning has a grid pitch ranging of 40-80 micron.

10. A method according to claim 1, wherein the connection pads are smaller than 80 micrometer.

11. A method according to claim 1, wherein the bonding material is a viscous thermosetting resin in an operating temperature region, wherein the viscosity ranges between 1 and 160 Pa·s.

12. A method according to claim 1, wherein the laser beam is restricted in timing and energy, in such a way that transferred bonding matter remains curable or consists of more than 10% volume percent of solder flux.

13. A bonding method of a micro-electronic component, in particular, a bare die component having one or more electrical connection pads, on a substrate having on its substrate surface a connection pad structure arranged for interconnecting the micro-electronic component via a respective one or more connection pads, the method comprising the steps of:
    providing a donor film comprising a curable conductive adhesive and a dynamic release layer;
    aligning a laser beam of a laser system and guiding the donor film distanced from the substrate surface;
    impinging the laser beam on the dynamic release layer; in such a way that the dynamic release layer is activated to cover a selected part of the connection pads or the connection pad structure with adhesive transferred from the donor film; wherein the laser beam is restricted in timing and energy, in such a way that the transferred adhesive remains curable;
    administering the micro-electronic component with its one or more electrical connection pads to the pad structure, so that the adhesive on one or both of the pads and the pad structure forms an electrical connection between the pad structure and a respective pad; and
    curing the conductive adhesive between the pads and the pad structure to bond the micro-electronic component with a shear strength of more than 1 Mpa.

14. A bonding method of a micro-electronic component, in particular, a bare die component having one or more electrical connection pads, on a substrate having on its substrate surface a connection pad structure arranged for interconnecting the micro- electronic component via a respective one or more connection pads, the method comprising the steps of:
    providing a donor film comprising a solder paste and a dynamic release layer;
    aligning a laser beam of a laser system and guiding the donor film distanced from the substrate surface;
    impinging the laser beam on the dynamic release layer; in such a way that the dynamic release layer is activated to cover a selected part of the connection pads or the connection pad structure with solder paste transferred from the donor film; wherein the laser beam is restricted in timing and energy, in such a way that the transferred solder paste includes flux consisting of more than 10% volume percent of flux;
    administering the micro-electronic component with its one or more electrical connection pads to the pad structure, so that the solder paste on one or both of the pads and the pad structure forms an electrical connection between the pad structure and a respective pad; and
    reflowing the solder paste between the pads and the pad structure to bond the micro-electronic component with a shear strength of more than 1 Mpa.

* * * * *